United States Patent
Jung et al.

(10) Patent No.: US 8,000,165 B2
(45) Date of Patent: Aug. 16, 2011

(54) SELF RESET CLOCK BUFFER IN MEMORY DEVICES

(75) Inventors: Changho Jung, San Diego, CA (US);
Nan Chen, San Diego, CA (US); Zhiqin Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 115 days.

(21) Appl. No.: 12/207,011

(22) Filed: Sep. 9, 2008

(65) Prior Publication Data

US 2010/0061161 A1    Mar. 11, 2010

(51) Int. Cl.
*G11C 8/00* (2006.01)
(52) U.S. Cl. ............ 365/233.1; 365/230.08; 365/233.11
(58) Field of Classification Search .............. 365/233.1, 365/230.08, 233.11
See application file for complete search history.

(56) References Cited

U.S. PATENT DOCUMENTS

| | | | |
|---|---|---|---|
| 6,222,791 B1 * | 4/2001 | Becker et al. | ............. 365/233.1 |
| 6,329,867 B1 | 12/2001 | Penney et al. | |
| 7,002,875 B2 | 2/2006 | Ikeda | |
| 7,116,150 B2 * | 10/2006 | Francom | ...................... 327/178 |
| 7,522,469 B2 | 4/2009 | Lee | |
| 7,646,658 B2 * | 1/2010 | Chen et al. | ................. 365/210.1 |
| 2005/0281129 A1 | 12/2005 | Ikeda | |

OTHER PUBLICATIONS

International Search Report and Written Opinion—PCT/US2009/056026, International Search Authority—European Patent Office—Mar. 9, 2010.

* cited by examiner

*Primary Examiner* — Son T Dinh
*Assistant Examiner* — Nam T Nguyen
(74) *Attorney, Agent, or Firm* — Michelle S. Gallardo

(57) ABSTRACT

A memory device includes a clock buffer circuit. The clock buffer circuit includes a cross-coupled logic circuit. The cross-coupled logic circuit has at least two logic gates in which an output of at least one of the logic gates is coupled to an input of at least one of the logic gates. The cross-coupled logic circuit is coupled to an input for accepting a clock signal. The memory device also includes a clock driver operable to generate a clock signal from the output of the cross-coupled logic circuit. A feedback loop from the clock signal to the cross-coupled logic circuit controls the cross-coupled logic circuit. A buffer circuit including a tri-state inverter is coupled to the clock signal to maintain the clock signal while avoiding contention with the clock generator. The memory device is enabled by a chip select signal.

17 Claims, 4 Drawing Sheets

SELF RESET CLOCK BUFFER IN MEMORY DEVICES

TECHNICAL FIELD

This disclosure generally relates to integrated circuits (ICs). More specifically, the disclosure relates to memory devices and, even more specifically, to clock buffering in memory devices.

BACKGROUND

A memory device or memory can generally be described as hardware that can store data for later retrieval. A clock buffer is an important element in memory operation. One purpose of the clock buffer is to produce a control clock for the memory from an external clock.

When the memory is accessed for read or write purposes, an internal clock signal provides synchronous timing within the memory. This internal clock signal is separate from the external clock of the circuitry that may be attached to the memory. Placing a complete clock generator within the memory is an expensive solution and occupies a large area of circuitry. Therefore, conventional memory uses a clock buffer to generate the internal memory clock from an external circuitry's clock. The internal memory clock controls timing of events such as latching memory addresses, bit line pre-charging, and selecting word lines.

A conventional clock buffer accepts an input clock signal as well as other signals from external circuitry and generates an output clock (internal memory clock) signal under certain combinations of the input signals. In a conventional clock buffer, a clock driver couples to the input clock signal as well as a delayed clock signal and outputs an intermediate clock signal. The clock driver generally has several transistors including a pFET configured to pull up the intermediate clock signal upon a reset signal and nFETs in series configured to pull-down upon a combination of a clock signal, delayed clock signal, and chip select signal. The intermediate clock signal is buffered through the use of a keeper circuit including two inverters. A clock inverter generates the output clock signal from the intermediate clock signal.

Shrinking transistor elements to 45 nm and below, reducing supply voltages to facilitate the smaller transistors, and a desire for lower power consumption have created multiple problems with conventional clock buffer circuitry found in memory.

One problem is that the pull down path of the clock generator is enabled by the external clock and disabled by a hard delay of the same external clock. The delay is required to ensure that the output of the clock generator is already pulled down when pull down by the clock generator is disabled. If the delay is not long enough, the clock generator will fail resulting in failure of the entire clock buffer circuit to output the desired internal memory clock.

Another problem lies in the use of the previously described delay. During the delay, the chip select line must stay low. The time the chip select line must stay low is the hold time and must be longer than the clock delay implemented in the circuit. The clock delay is on the order of 100-1000 picoseconds and commonly 300 picoseconds. The length of the hold time also affects the setup time for inputs to the memory latches. Use of a delay circuit in the clock buffer can cause timing violations leading to unstable memory operation. Moreover, the length of the optimal delay time varies across PVT conditions. Thus, the delay is often set longer than the minimum time required under ideal conditions. Consequently, the clock delay can be problematic.

A third problem in the conventional design is the use of two nFET transistors in the pull-down circuit. Two nFETs are used to perform the logic function of combining the clock and the delayed clock signals. nFETs are relatively large devices that require increased circuit area and, therefore, decrease the storage density of the memory. Additionally, the capacitance of the two nFETs increases the load on the external clock.

A fourth problem lies in the use of a latch in the keeper circuit of the conventional clock buffer circuit. The clock generator contends with the keeper circuit to change the memory clock from low to high or high to low. Under certain process conditions, such as low supply voltage or low temperature, the clock generator may not be capable of changing the output clock. Conventional supply voltages are over one volt and some are now less than one volt. Supply voltages in the range of 0.8-0.9 volts lead to conventional clock buffer failure. A failure of this type results in an incorrect output clock signal and failure in the memory circuitry.

Thus, there is a need for an improved clock buffer.

BRIEF SUMMARY

According to one aspect of this disclosure a memory device includes a cross-coupled logic circuit. The cross-coupled logic circuit has at least two logic gates in which an output of at least one of the logic gates is coupled to an input of at least one of the logic gates. The cross-coupled logic circuit is coupled to an input for accepting a clock signal. The memory device also includes a clock driver operable to generate a clock signal from the output of the cross-coupled logic circuit. A feedback loop from the clock signal to the cross-coupled logic circuit controls the cross-coupled logic circuit.

According to another aspect of this disclosure a clock buffering circuit includes a cross-coupled logic circuit. The cross-coupled logic circuit has at least two logic gates in which an output of at least one of the logic gates is coupled to an input of at least one of the logic gates. The cross-coupled logic circuit is coupled to an input for accepting a clock signal. The cross-coupled logic circuit also includes a clock driver operable to generate a clock signal from the output of the cross-coupled logic circuit. A feedback loop from the clock signal to the cross-coupled logic circuit controls the cross-coupled logic circuit.

According to yet another aspect of this disclosure a method for generating a clock signal includes receiving an input clock signal, generating a control signal from a cross-coupled logic circuit accepting input from the input clock signal and a feedback loop, driving a clock signal with the control signal, and feeding back the clock signal to a clock driver in the feedback loop.

According to another aspect of this disclosure a memory device includes means for cross-coupling an input clock signal and generating an output. The memory device also includes means for driving the output to generate a clock signal. Furthermore, a memory device includes means for feeding back the clock signal to the means for cross-coupling.

This disclosure has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the disclosure in the present application, reference is now made to the following descriptions taken in conjunction with the accompanying drawings.

DETAILED DESCRIPTION

Figure 1:
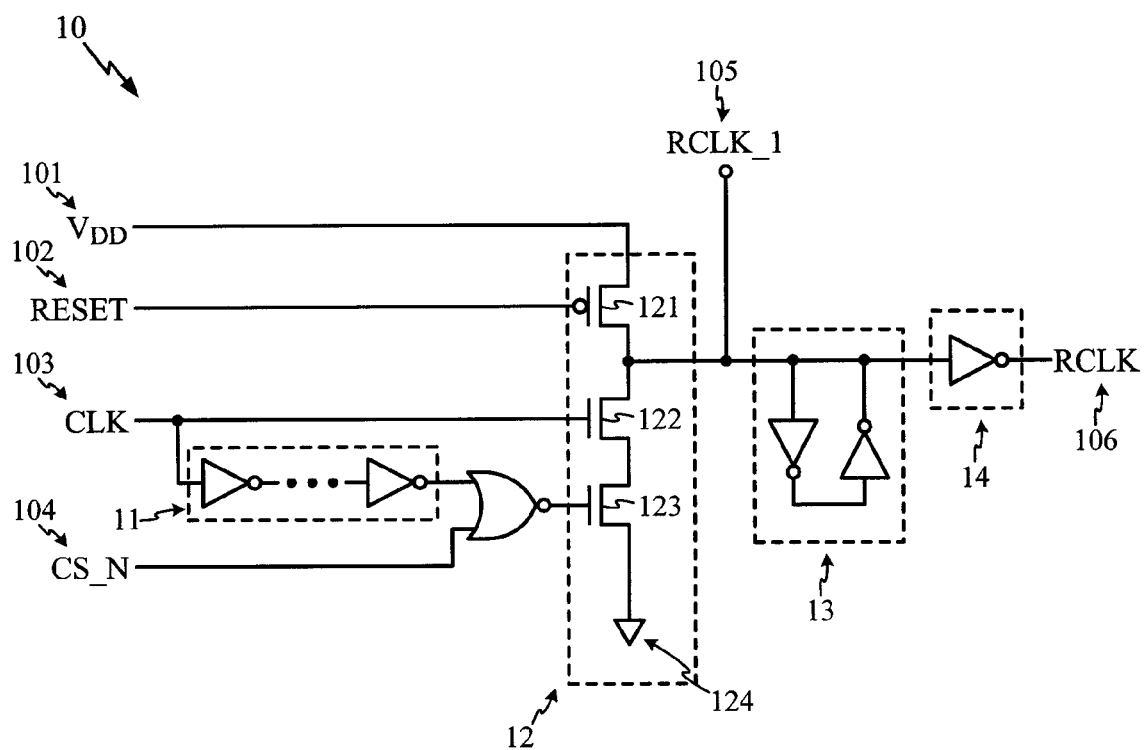
FIG. 1 is a circuit diagram showing a conventional clock buffer.

FIG. 1 is a circuit diagram showing a conventional clock buffer. A conventional electrical circuit 10 for clock buffering has inputs including a supply voltage 101, $V_{DD}$, a reset signal 102, RESET, an input clock signal 103, CLK, and a chip select signal 104, CS_N.

A clock delay circuit 11 in the memory electrical circuit 10 includes an even number of inverters that can be adjusted to obtain correct timing as discussed earlier. A clock driver 12 includes a pFET 121 coupled to the supply voltage 101 and the reset signal 102. The clock driver 12 also has an nFET 122 coupled to the clock signal 102 and an FET 123. The nFET 123 is coupled to the clock delay circuit 11 and a reference ground 124. The clock driver 12 produces an intermediate clock signal 105, RCLK_1. A keeper circuit 13 includes two inverters used to buffer the intermediate clock signal 105, RCLK_1. A clock inverter 14 delivers the output memory clock signal 106, RCLK. The keeper circuit 13 drives the intermediate clock signal 105, RCLK_1 to maintain the signal when the intermediate clock signal 105, RCLK_1, would otherwise be floating.

The conventional clock buffer illustrated in FIG. 1 has accompanying disadvantages such as problems resulting from the use of a hard delay, increased circuit area consumption by three transistors, increased load on the input clock line, large chip select signal 104, CS_N, hold time and contention of the output clock signal 106, RCLK, by the keeper circuit 13.

Figure 2:
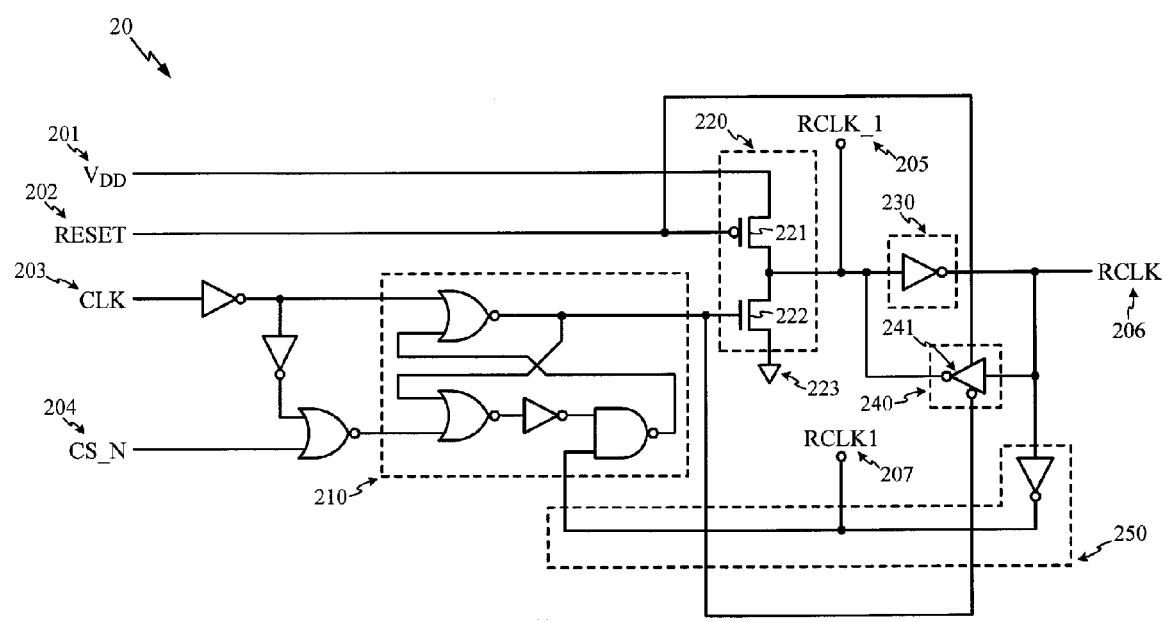
FIG. 2 is a circuit diagram showing an exemplary clock buffer featuring self reset functionality.

FIG. 2 is a circuit diagram showing an exemplary clock buffer featuring self reset functionality. An electrical circuit 20 includes self reset functionality that resets the clock driver following pull down of the output clock signal using feedback from the output clock to the cross-coupled logic circuit. The electrical circuit 20 has inputs including a supply voltage 201, $V_{DD}$, a reset signal 202, RESET, an input clock signal 203, CLK, and a chip select signal 204, CS_N. The electrical circuit 20 has an output clock signal 206, RCLK.

A cross-coupled logic circuit 210 couples the input clock signal 203 to a clock driver 220. The clock driver 220 includes a pFET 221 coupled to the supply voltage 201 and the reset signal 202. The clock driver 220 also has an nFET 222 coupled to the cross-coupled logic circuit 210 and a ground 223. An intermediate clock signal 205, RCLK_1, is output from the clock driver 220. A clock inverter 230 couples to the intermediate clock signal 205, RCLK_1, and provides the output clock signal 206, RCLK. A feedback loop 250 interposed between the output clock 206, RCLK, and the cross-coupled logic circuit 210 provides an output clock signal 207, RCLK1, to the cross-coupled logic circuit 210. A keeper circuit 240 interposed between the output clock signal 206, RCLK, and the intermediate clock signal 205, RCLK_1, includes a tri-state inverter 241 controlled by the reset signal 202 and the cross coupled logic circuit 210. The keeper circuit 240 drives the intermediate clock signal 205, RCLK_1 to maintain the signal when the intermediate clock signal 205, RCLK_1, would otherwise be floating.

Figure 3:
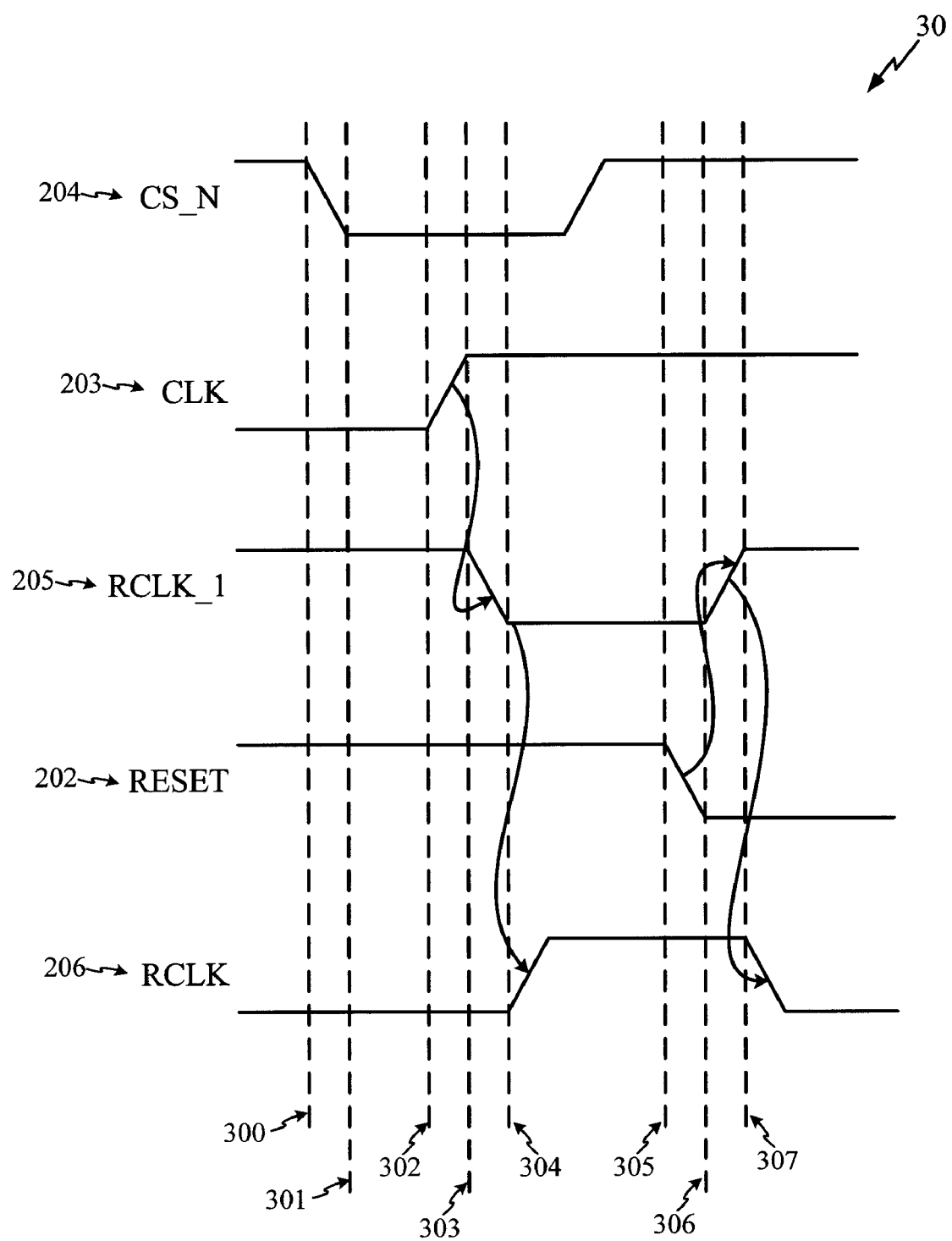
FIG. 3 is a timing diagram illustrating operation of an exemplary clock buffer featuring self reset functionality.

FIG. 3 is a timing diagram illustrating operation of an exemplary clock buffer featuring self reset functionality. A timing diagram 30 includes the chip select signal 204, CS_N, the input clock signal 203, CLK, the intermediate clock signal 205, RCLK_1, the reset signal 202, RESET, and the output clock signal 206, RCLK.

Operation of one output clock cycle of the electrical circuit 20 will now be demonstrated. An initial state of the memory circuit 300 includes the chip select signal 204, CS_N, high indicating the memory is disabled. At a state 301 the chip select signal 204, CS_N, goes low indicating the memory has been enabled.

The first half of the clock cycle begins at a state 302 when the input clock signal 203, CLK, begins a rising edge. The chip select signal 204, CS_N, remains low for at least a two gate delay following the rising edge of the input clock signal 203, CLK. At a state 303 the rising edge of the input clock signal 203, CLK, changes the output of the cross-coupled logic circuit 210 to high, which closes the nFET 222 and pulls down the intermediate clock signal 205, RCLK_1. At a state 304, the output clock 206, RCLK, rises in response to the intermediate clock signal 205, RCLK_1, being low. The feedback loop signal 207, RCLK1, goes low causing the output of the cross-coupled logic circuit 210 to open the transistor 222. The tri-state inverter 240 is enabled when the reset signal 202, RESET, is high and the output of the cross-coupled logic circuit 210 is low. The keeper circuit 240 continues to maintain the intermediate clock signal 205, RCLK_1, while both the nFET 222 and the pFET 221 are open.

The second half of the clock cycle begins at state 305 when the reset signal 305, RESET, falls. The tri-state inverter 240 is disabled when the reset signal 305, RESET, falls. At a state 306, the pFET 221 closes to pull the intermediate clock signal 205, RCLK_1, high. With the tri-state inverter 241 disabled, no contention of the intermediate clock signal 205, RCLK_1, occurs. At a state 307, the output clock signal 206, RCLK, goes low in response to the intermediate clock signal 205, RCLK_1, being high. This completes illustration of one cycle of the clock buffer circuit operation.

One advantage of the disclosed circuitry is the self reset functionality. The clock driver pull down path is disabled by feedback circuitry when the internal memory clock pulls down. The self reset capability is enabled by cross A second advantage of the disclosed circuitry is the shortened length of time necessary to hold the chip select line as a result of the cross-coupled circuitry. In the conventional design the chip select line must be low long enough to ensure the memory clock pull down has occurred. The cross-coupled circuitry resets the pull-down transistor after the memory clock pulls down replacing the delay circuitry previously used. Shortening the chip select hold time reduces timing violations.

A third advantage of the disclosed circuitry is the removal of one nFET from the clock driver of the conventional clock buffer circuit. Only a single nFET is needed when the cross-coupled circuitry is used. The use of fewer transistors results in higher performance, less occupied circuit area, and lower load on the input clock line.

A fourth advantage of the disclosed circuitry is the replacement of the latch circuitry with a tri-state inverter. Using the tri-state inverter as part of the keeper circuit prevents contention of the memory clock line between the keeper circuit and the clock driver. The pull-up transistor will be able to pull-up the intermediate clock signal without competition from the keeper circuit. As a result, lower supply voltages, such as less than one volt, will not cause failure in the clock buffer circuit, enabling more power efficient circuits to be designed.

These advantages are made possible, in part, by the use of cross-coupled circuitry coupled to a clock generator that enables the clock generator to self reset.

Figure 4:
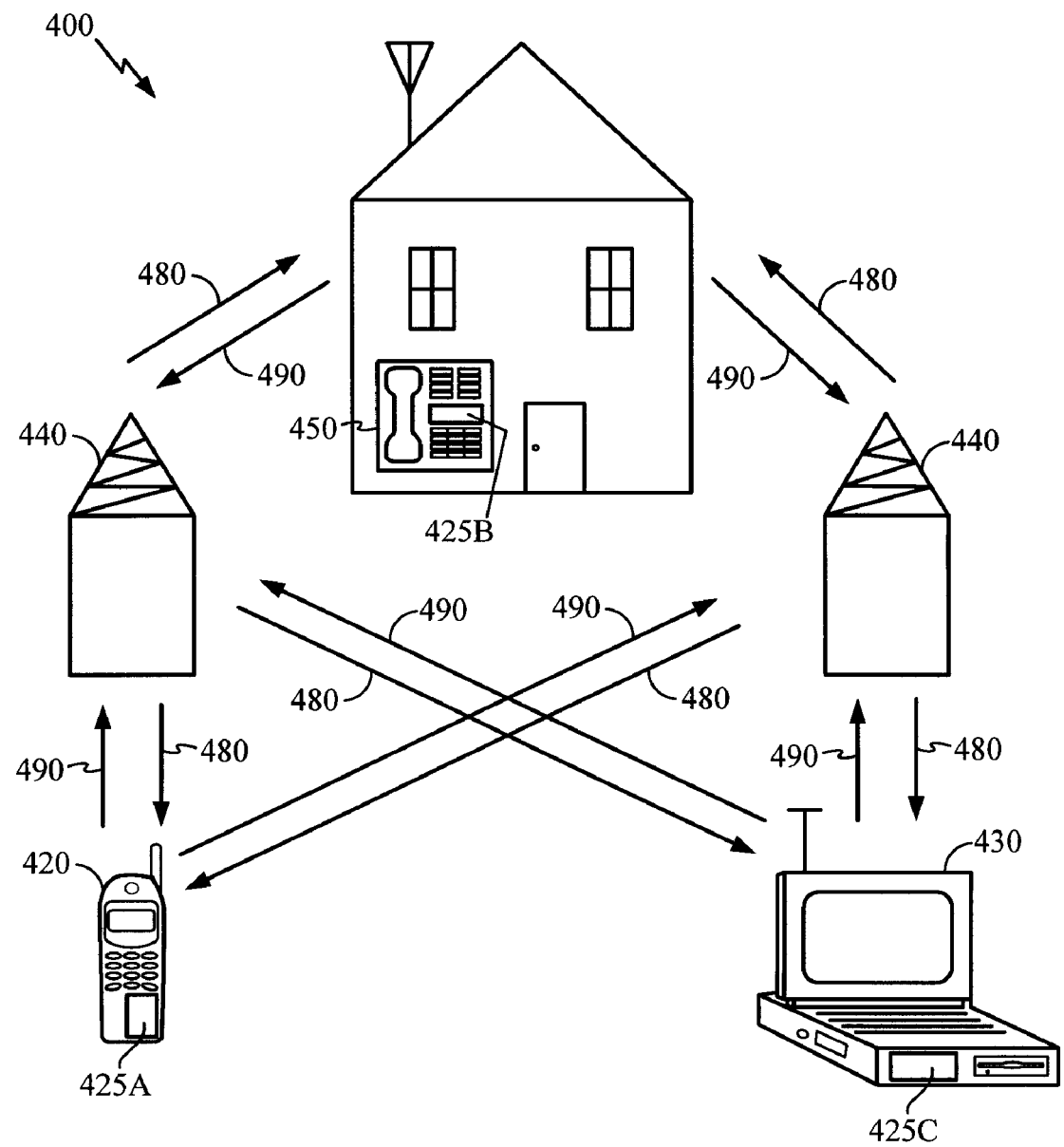
FIG. 4 is a block diagram showing an exemplary wireless communication system in which an embodiment of the disclosure may be advantageously employed.

FIG. 4 shows an exemplary wireless communication system 400 in which an embodiment of the disclosure may be advantageously employed. For purposes of illustration, FIG. 4 shows three remote units 420, 430, and 450 and two base stations 440. It will be recognized that typical wireless communication systems may have many more remote units and base stations. Remote units 420, 430, and 450 include IC devices 425A, 425B, and 425C, having the disclosed clock buffering circuit. It will be recognized that any device containing memory may also include the clock buffering circuit disclosed here, including the base units. FIG. 4 shows forward link signals 480 from the base stations 440 and the remote units 420, 430, and 450 and reverse link signals 490 from the remote units 420, 430, and 450 to base stations 440.

In FIG. 4, remote unit 420 is shown as a mobile telephone, remote unit 430 is shown as a portable computer, and remote unit 450 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 4 illustrates remote units according to the teachings of the disclosure, the disclosure is not limited to these exemplary illustrated units. The disclosure may be suitably employed in any device which includes memory devices.

Coupling as set forth in this document refers to any method available to transmit signals from one location to a second location either directly or indirectly. This commonly includes electrical connections.

Although specific circuitry has been set forth, it will be appreciated by those skilled in the art that not all of the disclosed circuitry is required to practice the disclosure. Moreover, certain well known circuits have not been described so as to maintain focus on the disclosure. Similarly, although the description refers to logical "0" or "low" and logical "1" or "high" in certain locations, one skilled in the art appreciates that the logical values can be switched, with the remainder of the circuit adjusted accordingly, without affecting operation of the present disclosure.

Although the present disclosure and its advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A memory device comprising:
   a cross-coupled logic circuit comprising at least two logic gates in which an output of at least one of the logic gates is coupled to an input of at least one of the logic gates, the cross-coupled logic circuit coupled to an input for accepting a clock signal;
   a clock driver operable to generate a clock signal from an output of the cross-coupled logic circuit;
   a feedback loop from the clock signal to the cross-coupled logic circuit to control the cross-coupled logic circuit; and
   a keeper circuit operable to maintain a state of the clock signal when the clock signal is otherwise floating, the keeper circuit receiving the clock signal.

2. The memory device of claim 1, further comprising a clock inverter operable to generate an output clock signal from the clock signal.

3. The memory device of claim 1, in which the keeper circuit comprises a tri-state inverter.

4. The memory device of claim 3, in which the tri-state inverter is controlled by the cross-coupled logic circuit and a reset signal.

5. The memory device of claim 1, in which the cross-coupled logic circuit is coupled to another input for accepting a chip select signal.

6. The memory device of claim 1, in which the clock driver comprises a pFET transistor controlled by input from a RESET signal and an nFET transistor controlled by input from the cross-coupled logic circuit.

7. The memory device of claim 1, in which the memory device is coupled to a microprocessor.

8. The memory device of claim 7, in which the memory device and microprocessor are integrated into a communications device.

9. A clock buffering circuit comprising:
   a cross-coupled logic circuit comprising at least two logic gates in which an output of at least one of the logic gates is coupled to an input of at least one of the logic gates, the cross-coupled logic circuit coupled to an input for accepting a clock signal;
   a clock driver operable to generate a clock signal from an output of the cross-coupled logic circuit;
   a feedback loop from the clock signal to the cross-coupled logic circuit to control the cross-coupled logic circuit; and
   a keeper circuit operable to maintain the state of the clock signal when the clock signal is otherwise floating, the keeper circuit receiving the clock signal.

10. The clock buffering circuit of claim 9, further comprising a clock inverter operable to generate an output clock signal from the clock signal.

11. The clock buffering circuit of claim 9, in which the keeper circuit comprises a tri-state inverter controlled by the cross-coupled logic circuit and a reset signal.

12. A method for generating a clock signal comprising:
receiving an input clock signal;
generating a control signal from a cross-coupled logic circuit, the cross-coupled logic circuit accepting inputs from the input clock signal and a feedback loop;
driving a clock signal with the control signal;
feeding back the clock signal in the feedback loop; and
maintaining the state of the clock signal when the clock signal is otherwise floating.

13. The method of claim 12 further comprising inverting the clock signal to obtain an output clock signal.

14. A memory device comprising:
means for cross-coupling an input clock signal and generating an output;
means for driving the output to generate a clock signal;
means for feeding back the clock signal to the means for cross-coupling; and
means for maintaining the state of the clock signal when the clock signal is otherwise floating.

15. The memory device of claim 14, further comprising a means for inverting the clock signal to obtain an output clock signal.

16. The memory device of claim 14, further comprising a means for buffering the clock signal.

17. The memory device of claim 14, further comprising a means for maintaining the clock signal while avoiding contention of the clock signal.

* * * * *